United States Patent [19]

Lindmayer

[11] 4,093,473

[45] June 6, 1978

[54] SOLAR PANEL WITH UV ABSORBER

[76] Inventor: Joseph Lindmayer, 6919 Blaisdell Rd., Bethesda, Md. 20034

[21] Appl. No.: 806,868

[22] Filed: June 15, 1977

Related U.S. Application Data

[63] Continuation-in-part of Ser. No. 715,407, Aug. 25, 1976, Pat. No. 4,057,939.

[51] Int. Cl.$^2$ ............................................. H01L 31/04
[52] U.S. Cl. ................................ 136/89 P; 136/89 H
[58] Field of Search ......................... 136/89 P, 89 H; 260/448.2 S

[56] References Cited

U.S. PATENT DOCUMENTS

| | | | |
|---|---|---|---|
| 2,945,838 | 7/1960 | Prober | 260/448.2 S |
| 3,996,067 | 12/1976 | Broder | 136/89 |
| 4,009,054 | 2/1977 | Gochermann et al. | 136/89 P |

*Primary Examiner*—John H. Mack
*Assistant Examiner*—William T. Leader

[57] ABSTRACT

A solar panel including photovoltaic cells encapsulated in a silicone resin containing an ultraviolet light absorber that will inhibit corrosion of metallic cell parts and resin delamination while having no substantial, adverse effect on curing of the resin.

10 Claims, No Drawings

SOLAR PANEL WITH UV ABSORBER

This application is a continuation-in-part of my copending application Ser. No. 715,407, filed Aug. 25, 1976, now U.S. Pat. No. 4,057,939 and entitled, Solar Panel.

The present invention relates generally to frames, trays and other enclosures for holding photovoltaic cells in position so that incident light may impinge on a surface of the cell, thereby generating electrons that can, by suitable means, be directed away from the cells and stored or utilized directly. More particularly, the present invention is directed to such a solar panel in which one or more cells are encapsulated in a substantially clear resin so that the cells are protected from ambient conditions that would be deleterious to the function of the cells.

In my copending application referenced hereinbefore, a solar panel is described and illustrated in which the cells, which may vary in form but are usually rectangular or circular, are mounted in a tray that has a flat base and an open top. The cells are encapsulated in a cured layer of silicone rubber or resin that has the function of protecting the cells from surrounding conditions, e.g., dust, dirt, hail and the like that may adversely affect the cell's performance. However, as pointed out in the application, adherence of the silicone resin to the base member of the tray has been a problem. Delamination, i.e., separation of silicone resin from the normally flat bottom of the tray, can render the solar panel nonfunctional. At best, such delamination causes the panel to become unsightly and reduces the quantum of radiant energy impinging on one or more of the cells by varying the angle at which incident light strikes the cells over a period of time.

My prior application disclosed and claimed a solar panel in which this problem of delamination was at least partially overcome by using multiple layers of resin. Nonetheless, the problem has persisted, albeit to a lesser extent. With or without use of the multiple layer structure of my prior application, I have noted that where delamination has been most prevalent, it has occurred at areas of contact between the silicone resin and the base member of the tray made, e.g., of epoxy fiberglass, which areas were not directly beneath the solar cells encapsulated by the resin. This relationship had led to the discovery as a result of which the present invention has evolved: an important cause of resin delamination is ultraviolet light.

Light energy in the ultraviolet region of the spectrum, i.e., light having a wavelength typically less than .4 microns, appears to be a significant cause of the peeling away of silicone resin cell encapsulant from a base member of a tray. Further, I have recognized that corrosion of the metal parts of solar cell systems are enhanced by the presence of moisture and ultraviolet light, hereinafter sometimes referred to a UV light. Elimination or at a minimum, drastic curtailment of light from the UV portion of the spectrum is perceived to have definite advantages in the solar panel art. Since UV light contributes little to the production of electrical energy when visible light strikes a photovoltaic cell, the loss of resultant electrical energy will not be significant detraction when compared to the benefits obtained.

It is, therefore, the primary object of the present invention to provide a substrate, panel or other housing for photovoltaic cells in which the cells are encapsulated in a transparent resin that will not transmit substantial amounts of light in the UV portion of the spectrum.

I have accomplished this object by utilizing a UV absorber in encapsulating the resin for the cells. That absorber, however, must have several distinguishing characteristics. First, it must not be of such optical characteristics that it will seriously inhibit transmission of visible and infrared light through the resin to the solar cells. Second, it should be in the form of either a liquid, which is preferable, or a finely divided solid. Third, it should not interfere with curing of the encapsulating resin. With such resin encapsulating the solar cells, it has been found that delamination of the resin from the tray will be inhibited, as will corrosion of the metal parts of the cells.

With respect to other features of my invention, I have found that when a silicone resin is used as the encapsulating medium, an acrylonitrile UV absorber meets these qualifications. Thus, a liquid, 2-ethylhexyl-2-cyano-3, 3 diphenylacrylate is preferred in an amount of about 0.5% by weight of the resin. The preferred finely divided solid absorber is ethyl-2-cyano-3, 3 diphenylacrylate. When a panel according to said copending application Serial No. 715,407 is employed, the UV absorber will at least be present in the thicker, multicomponent layer of silicone resin, although it may also be present in the thinner, single-component layer as well.

In regard to specific UV absorbers that have been found to meet the criteria delineated hereinbefore, substituted by acrylonitriles are preferred, particularly those marketed under the trademark UVINUL N-539 by GAF Corp. That absorber is described in GAF's Technical Bulletin 7543-104, which is entitled UVINUL N, and also includes a description of UVINUL N-35, a powder as contrasted with UVINUI N-539, a viscous oil. UVINUI N-593 chemically is 2-ethylhexyl-2-cyano-3, 3-diphenyl acrylate; UVINUL N-35 is ethyl-2-cyano-3, 3-diphenylacrylate.

In the preferred embodiment of the present invention, a tray as described in my prior above mentioned application, the disclosure of which is incorporated herein by reference, was produced as described therein, except that to the multipart silicone resin, identified as Sylgard 182 of Dow Corning Corp., was added 0.5% UVINUl N-539 as well as 10 percent curing agent. The mix was stirred until the absorber had been completely and uniformly distributed throughout the resin, with which it was miscible. The resulting structure was the illustrated in the drawings of said prior application, i.e., a solar panel in the form of a tray having side and end members and a base member which, in this instance, was formed of epoxy fiberglass, although there are other materials from which the base member may be formed that appear to have similar characteristics, e.g., a polyester board. Over the base member is a cured layer of single-component silicone resin, specifically, a resin manufactured by General Electric Company, Waterford, N.Y. and identified as single-component RTV silicone rubber adhesive/sealant. Most preferably, the layer is about 2 mils in thickness. Then, conterminous with the layer of single-component resin, is a substantially thicker layer of the multi-component silicone resin, in this instance Sylgard 182, manufactured by Dow Corning Corp., together with about 0.5% UV absorber as specified. The solar energy cells are completely encapsulated in the multi-component silicone resin, which extends substantially to the uppermost portions of the side and end walls of the tray.

The quantity of UV absorber added has not been completely determined for every possible absorber and may well vary with different absorbers. However, with UVINUL N-539, approximately 0.5% by weight was deemed an optimum amount. In lower concentrations, the effectiveness of the absorber decreased. In amounts as high as 2% by weight, some wetting out, i.e., separation of the liquid absorber from the remainder of the multi-part resin, was observed.

The characteristics of a UV absorber that will function effectively have been set forth hereinbefore. Experimental results showed that absorbers were operable with the silicone resin that constitutes the preferred embodiment of my invention. Thus, other than the UVINUL N539 and N-35, the only other operable UV absorber of which I am aware is a material sold by Dow Corning Corp. as a primer for silicone rubber and identified by the trademark 1200. The primer is a naphtha solution and is described in Bulletin 63-002. However, use of this material appears to result in cosmetic difficulties, since a reddish coloration results, which then disappears after lengthy exposure to sunlight. While such coloration may not singularly affect the activity of the primer as a UV absorber, it does result in a change of color in the silicone resin; consequently, it can cause a user to think operability has been affected and, from a sales point of view, is most certainly not preferred. Other UV absorbers that have been tried and discarded by me include titanium dioxide and tantalum oxide, as well as other oxides. It was found that the granules of these powdered materials are extremly difficult to distribute uniformly in the resin. Lack of uniform distribution will result in passage of light between adjacent granules.

It will be apparent to those of skill in this art that certain additions, alterations and modifications may be made in the preferred embodiment of the present invention as disclosed herein. For example, if a resin other than silicone rubber is utilized to encapsulate the solar cells, it may well be that UV absorbers other than those that I have found to be preferred when a silicone resin is utilized as the encapsulant will thereby become preferred. As to all such additions, alterations and modifications, therefore, it is my intent that they be included within the purview of my invention, which is to be limited only by the scope, including equivalents, of the following, appended claims.

I claim:

1. A solar panel for maintaining solar energy cells in position to receive light impinging thereon, comprising a substrate on which said cells are mounted, a layer of silicone resin adhesively secured to said substrate and photovoltaic cells disposed within and encapsulated by said resin layer, said layer having distributed therein an ultraviolet light absorber in the form of a liquid or finely divided solid in an amount that will absorb sufficient ultraviolet light impinging on said layer to mitigate corrosion of metal parts of said cells and inhibit delamination of said resin from said substrate while having no adverse effect on curing of said resin.

2. A solar panel as claimed in claim 1, in which said ultraviolet light absorber is a liquid.

3. A solar panel as claimed in claim 2, in which said UV absorber is a substituted acrylonitrile.

4. A solar panel as claimed in claim 3, in which said UV absorber is 2-ethylhexyl-2-cyano-3,3-diphenylacrylate.

5. A solar panel as claimed in claim 1, in which said UV absorber is a dispersion of finely divided particles of ethyl-2-cyano-3,3-diphenylacrylate.

6. A solar panel as claimed in claim 2, in which said liquid ultraviolet light absorber is present in an amount of about 0.5% by weight of said resin.

7. A solar panel as claimed in claim 2, in which said UV absorber is a solution of naphtha.

8. A solar panel for maintaining solar energy cells in position to receive light impinging thereon, comprising a tray within which said cells are mounted, said tray including side and end members and a base member having a substantially planar surface within the space bounded by said tray, a layer of cured single-component silicone resin adhesively adhered to said planar surface, a layer of cured multi-component silicone resin adhered to said single-component layer, said multi-component resin having distributed therethrough an ultraviolet light absorber in the form of a liquid or finely divided solid particles, said single-component layer being thinner than said multi-component layer, and photovoltaic cells disposed within and encapsulated by said multi-component layer so that said cells are maintained by said panel in position to receive light impinging on surfaces thereof and convert such light into electrical energy while being protected from ambient conditions, deleterious effects of ultraviolet light on said cells, and delamination of said resins from said tray.

9. A solar panel as claimed in claim 8, in which said UV absorber is also present in said single-component layer.

10. A solar panel as claimed in claim 8, in which said UV absorber is liquid and is present in an amount of about 0.5% by weight of said multi-component layer.

* * * * *